(12) United States Patent
Fu et al.

(10) Patent No.: US 8,895,396 B1
(45) Date of Patent: Nov. 25, 2014

(54) EPITAXIAL PROCESS OF FORMING STRESS INDUCING EPITAXIAL LAYERS IN SOURCE AND DRAIN REGIONS OF PMOS AND NMOS STRUCTURES

(71) Applicant: United Microelectronics Corp., Hsin-Chu (TW)

(72) Inventors: Ssu-I Fu, Kaohsiung (TW); Yu-Hsiang Hung, Tainan (TW); Cheng-Guo Chen, Changhua County (TW); Chung-Fu Chang, Tainan (TW); Chien-Ting Lin, Hsinchu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/940,220

(22) Filed: Jul. 11, 2013

(51) Int. Cl.
  *H01L 21/8236* (2006.01)
  *H01L 21/8234* (2006.01)
(52) U.S. Cl.
  CPC .............................. *H01L 21/823418* (2013.01)
  USPC ............ 438/278; 438/197; 438/199; 438/275
(58) Field of Classification Search
  None
  See application file for complete search history.

(56) References Cited

U.S. PATENT DOCUMENTS

| | | |
|---|---|---|
| 4,891,303 A | 1/1990 | Garza |
| 5,217,910 A | 6/1993 | Shimizu |
| 5,273,930 A | 12/1993 | Steele |
| 5,356,830 A | 10/1994 | Yoshikawa |
| 5,372,957 A | 12/1994 | Liang |
| 5,385,630 A | 1/1995 | Philipossian |
| 5,399,506 A | 3/1995 | Tsukamoto |
| 5,447,884 A | 9/1995 | Fahey |
| 5,625,217 A | 4/1997 | Chau |
| 5,777,364 A | 7/1998 | Crabbe |
| 5,783,478 A | 7/1998 | Chau |
| 5,783,479 A | 7/1998 | Lin |
| 5,960,322 A | 9/1999 | Xiang |
| 6,030,874 A | 2/2000 | Grider |
| 6,048,756 A | 4/2000 | Lee |
| 6,074,954 A | 6/2000 | Lill |
| 6,100,171 A | 8/2000 | Ishida |
| 6,110,787 A | 8/2000 | Chan |
| 6,165,826 A | 12/2000 | Chau |
| 6,165,881 A | 12/2000 | Tao |
| 6,191,052 B1 | 2/2001 | Wang |
| 6,228,730 B1 | 5/2001 | Chen |
| 6,245,626 B1 | 6/2001 | Chen |
| 6,274,447 B1 | 8/2001 | Takasou |
| 6,355,533 B2 | 3/2002 | Lee |
| 6,365,476 B1 | 4/2002 | Talwar |
| 6,368,926 B1 | 4/2002 | Wu |

(Continued)

*Primary Examiner* — Charles Garber
*Assistant Examiner* — Brigitte Paterson
(74) *Attorney, Agent, or Firm* — Winston Hsu; Scott Margo

(57) ABSTRACT

An epitaxial process includes the following steps. A first gate and a second gate are formed on a substrate. Two first spacers are formed on the substrate beside the first gate and the second gate respectively. Two first epitaxial layers having first profiles are formed in the substrate beside the two first spacers respectively. A second spacer material is formed to cover the first gate and the second gate. The second spacer material covering the second gate is etched to form a second spacer on the substrate beside the second gate and expose the first epitaxial layer beside the second spacer while reserving the second spacer material covering the first gate. The exposed first epitaxial layer in the substrate beside the second spacer is replaced by a second epitaxial layer having a second profile different from the first profile.

18 Claims, 4 Drawing Sheets

(56) References Cited

U.S. PATENT DOCUMENTS

| | | |
|---|---|---|
| 6,444,591 B1 | 9/2002 | Schuegraf |
| 6,537,370 B1 | 3/2003 | Hernandez |
| 6,544,822 B2 | 4/2003 | Kim |
| 6,605,498 B1 | 8/2003 | Murthy |
| 6,613,695 B2 | 9/2003 | Pomarede |
| 6,621,131 B2 | 9/2003 | Murthy |
| 6,624,068 B2 | 9/2003 | Thakar |
| 6,632,718 B1 | 10/2003 | Grider |
| 6,642,122 B1 | 11/2003 | Yu |
| 6,652,718 B1 | 11/2003 | D'Couto |
| 6,664,156 B1 | 12/2003 | Ang |
| 6,676,764 B2 | 1/2004 | Joo |
| 6,699,763 B2 | 3/2004 | Grider |
| 6,703,271 B2 | 3/2004 | Yeo |
| 6,777,275 B1 | 8/2004 | Kluth |
| 6,806,151 B2 | 10/2004 | Wasshuber |
| 6,809,402 B1 | 10/2004 | Hopper |
| 6,858,506 B2 | 2/2005 | Chang |
| 6,861,318 B2 | 3/2005 | Murthy |
| 6,864,135 B2 | 3/2005 | Grudowski |
| 6,869,867 B2 | 3/2005 | Miyashita |
| 6,887,751 B2 | 5/2005 | Chidambarrao |
| 6,887,762 B1 | 5/2005 | Murthy |
| 6,891,192 B2 | 5/2005 | Chen |
| 6,930,007 B2 | 8/2005 | Bu |
| 6,946,350 B2 | 9/2005 | Lindert |
| 6,962,856 B2 | 11/2005 | Park |
| 6,972,461 B1 | 12/2005 | Chen |
| 6,991,979 B2 | 1/2006 | Ajmera |
| 6,991,991 B2 | 1/2006 | Cheng |
| 7,037,773 B2 | 5/2006 | Wang |
| 7,060,576 B2 | 6/2006 | Lindert |
| 7,060,579 B2 | 6/2006 | Chidambaram |
| 7,112,495 B2 | 9/2006 | Ko |
| 7,118,952 B2 | 10/2006 | Chen |
| 7,118,987 B2 | 10/2006 | Fu |
| 7,119,404 B2 | 10/2006 | Chang |
| 7,132,338 B2 | 11/2006 | Samoilov |
| 7,138,323 B2 | 11/2006 | Kavalieros |
| 7,169,675 B2 | 1/2007 | Tan |
| 7,183,596 B2 | 2/2007 | Wu |
| 7,202,124 B2 | 4/2007 | Fitzgerald |
| 7,217,627 B2 | 5/2007 | Kim |
| 7,271,464 B2 | 9/2007 | Trivedi |
| 7,288,822 B1 | 10/2007 | Ting |
| 7,303,999 B1 | 12/2007 | Sriraman |
| 7,314,793 B2 | 1/2008 | Frohberg |
| 7,335,959 B2 | 2/2008 | Curello |
| 7,396,728 B2 | 7/2008 | Varghese |
| 7,410,859 B1 | 8/2008 | Peidous |
| 7,442,967 B2 | 10/2008 | Ko |
| 7,456,067 B2 | 11/2008 | Ang |
| 7,462,239 B2 | 12/2008 | Brabant |
| 7,482,245 B1 | 1/2009 | Yu |
| 7,491,615 B2 | 2/2009 | Wu |
| 7,494,856 B2 | 2/2009 | Zhang |
| 7,494,858 B2 | 2/2009 | Bohr |
| 7,517,816 B2 | 4/2009 | Frohberg |
| 7,550,336 B2 | 6/2009 | Hsiao |
| 7,592,231 B2 | 9/2009 | Cheng |
| 7,667,227 B2 | 2/2010 | Shimamune |
| 7,670,934 B1 * | 3/2010 | Pal et al. .................. 438/481 |
| 7,691,752 B2 | 4/2010 | Ranade |
| 7,838,370 B2 | 11/2010 | Mehta |
| 7,892,932 B2 | 2/2011 | Cheng |
| 8,124,473 B2 | 2/2012 | Pan |
| 2002/0135071 A1 | 9/2002 | Kang |
| 2002/0160587 A1 | 10/2002 | Jagannathan |
| 2002/0182423 A1 | 12/2002 | Chu |
| 2003/0181005 A1 | 9/2003 | Hachimine |
| 2003/0203599 A1 | 10/2003 | Kanzawa |
| 2004/0045499 A1 | 3/2004 | Langdo |
| 2004/0067631 A1 | 4/2004 | Bu |
| 2004/0227164 A1 | 11/2004 | Lee |
| 2005/0070076 A1 | 3/2005 | Dion |
| 2005/0079692 A1 | 4/2005 | Samoilov |
| 2005/0082616 A1 | 4/2005 | Chen |
| 2005/0139231 A1 | 6/2005 | Abadie |
| 2005/0260830 A1 | 11/2005 | Kwon |
| 2005/0285193 A1 | 12/2005 | Lee |
| 2005/0287752 A1 | 12/2005 | Nouri |
| 2006/0001095 A1 | 1/2006 | Doris |
| 2006/0051922 A1 | 3/2006 | Huang |
| 2006/0057859 A1 | 3/2006 | Chen |
| 2006/0076627 A1 | 4/2006 | Chen |
| 2006/0088968 A1 | 4/2006 | Shin |
| 2006/0115949 A1 | 6/2006 | Zhang |
| 2006/0163558 A1 | 7/2006 | Lee |
| 2006/0197161 A1 | 9/2006 | Takao |
| 2006/0228842 A1 | 10/2006 | Zhang |
| 2006/0231826 A1 | 10/2006 | Kohyama |
| 2006/0258126 A1 | 11/2006 | Shiono |
| 2006/0276014 A1 * | 12/2006 | Hsu et al. .................. 438/526 |
| 2006/0281245 A1 | 12/2006 | Okuno |
| 2006/0281288 A1 | 12/2006 | Kawamura |
| 2006/0292779 A1 | 12/2006 | Chen |
| 2006/0292783 A1 | 12/2006 | Lee |
| 2007/0023847 A1 | 2/2007 | Rhee |
| 2007/0034906 A1 | 2/2007 | Wang |
| 2007/0049014 A1 | 3/2007 | Chen |
| 2007/0072353 A1 | 3/2007 | Wu |
| 2007/0072376 A1 | 3/2007 | Chen |
| 2007/0082451 A1 | 4/2007 | Samoilov |
| 2007/0128783 A1 | 6/2007 | Ting |
| 2007/0141852 A1 | 6/2007 | Stapelmann |
| 2007/0166929 A1 | 7/2007 | Matsumoto |
| 2007/0262396 A1 | 11/2007 | Zhu |
| 2008/0014688 A1 | 1/2008 | Thean |
| 2008/0061366 A1 | 3/2008 | Liu |
| 2008/0067545 A1 | 3/2008 | Rhee |
| 2008/0076236 A1 | 3/2008 | Chiang |
| 2008/0085577 A1 | 4/2008 | Shih |
| 2008/0116525 A1 | 5/2008 | Liu |
| 2008/0124874 A1 | 5/2008 | Park |
| 2008/0128746 A1 | 6/2008 | Wang |
| 2008/0142886 A1 | 6/2008 | Liao |
| 2008/0173947 A1 | 7/2008 | Hou |
| 2008/0220579 A1 | 9/2008 | Pal |
| 2008/0233722 A1 | 9/2008 | Liao |
| 2008/0233746 A1 | 9/2008 | Huang |
| 2008/0242020 A1 | 10/2008 | Chen |
| 2009/0039389 A1 | 2/2009 | Tseng |
| 2009/0045456 A1 | 2/2009 | Chen |
| 2009/0095992 A1 | 4/2009 | Sanuki |
| 2009/0117715 A1 | 5/2009 | Fukuda |
| 2009/0124056 A1 | 5/2009 | Chen |
| 2009/0159981 A1 | 6/2009 | Niimi |
| 2009/0166625 A1 | 7/2009 | Ting |
| 2009/0184402 A1 | 7/2009 | Chen |
| 2009/0186475 A1 | 7/2009 | Ting |
| 2009/0230439 A1 | 9/2009 | Wang |
| 2009/0246922 A1 | 10/2009 | Wu |
| 2009/0278170 A1 | 11/2009 | Yang |
| 2009/0289284 A1 | 11/2009 | Goh |
| 2009/0302348 A1 | 12/2009 | Adam |
| 2010/0001317 A1 | 1/2010 | Chen |
| 2010/0093147 A1 | 4/2010 | Liao |
| 2010/0184359 A1 | 7/2010 | Park |
| 2012/0223364 A1 * | 9/2012 | Chung et al. .................. 257/192 |
| 2013/0149830 A1 * | 6/2013 | Rhee et al. .................. 438/303 |

* cited by examiner

US 8,895,396 B1

EPITAXIAL PROCESS OF FORMING STRESS INDUCING EPITAXIAL LAYERS IN SOURCE AND DRAIN REGIONS OF PMOS AND NMOS STRUCTURES

BACKGROUND OF THE INVENTION

1. Field of the Invention

The present invention relates generally to an epitaxial process, and more specifically to an epitaxial process that forms two different epitaxial layers beside two gates.

2. Description of the Prior Art

For decades, chip manufacturers have made metal-oxide-semiconductor (MOS) transistors faster by making them smaller. As the semiconductor processes advance to very deep sub micron era, such as 65-nm node or beyond, how to increase the driving current in MOS transistors has become a critical issue. In order to improve the device performances, crystal strain technology has been developed. Crystal strain technology is becoming more and more attractive as a means for getting better performance in the field of MOS transistor fabrication. Putting a strain on a semiconductor crystal alters the speed at which charges move through that crystal. Strain makes MOS transistors work better by enabling electrical charges, such as electrons, to pass more easily through the silicon lattice of the gate channel.

In the known art, attempts have been made to use a strained silicon layer, which has been grown epitaxially on a silicon substrate with a silicon germanium (SiGe) epitaxial layer or a silicon carbide (SiC) epitaxial layer disposed in between. In this type of MOS transistor, a biaxial compressive or tensile strain is induced in the epitaxy silicon layer due to the silicon germanium or silicon carbide having a larger or smaller lattice constant than silicon, and, as a result, the band structure is altered, and the carrier mobility increases. This enhances the speed performances of the MOS transistors.

SUMMARY OF THE INVENTION

The present invention provides an epitaxial process, which forms first epitaxial layers beside first gates and second gates simultaneously, and then replaces the first epitaxial layers beside the second gates by second epitaxial layers, thereby forming two transistors having different epitaxial layers.

The present invention provides an epitaxial process including the following steps. A first gate and a second gate are formed on a substrate. Two first spacers are formed on the substrate beside the first gate and the second gate respectively. Two first epitaxial layers having first profiles are formed in the substrate beside the two first spacers respectively. A second spacer material is formed to cover the first gate and the second gate. The second spacer material covering the second gate is etched to form a second spacer on the substrate beside the second gate and to expose the first epitaxial layer beside the second spacer while reserving the second spacer material covering the first gate. The exposed first epitaxial layer in the substrate beside the second spacer is replaced by a second epitaxial layer having a second profile different from the first profile.

According to the above, the present invention provides an epitaxial process, which forms first spacers beside a first gate and a second gate simultaneously, forms first epitaxial layers beside the first spacers simultaneously and then replaces the first epitaxial layer beside the second gate by a second epitaxial layer. Thus, the first epitaxial layer suited for forming an NMOS transistor and the second epitaxial layer suited for forming a PMOS transistor can be formed. Only one lithography process is performed in the present invention, so the boundary area overlapped or uncovered by two photoresists while performing the lithography processes twice of the prior art for forming different epitaxial layers can be avoided, thereby avoiding over-etching and avoiding the presence of residues of materials in the boundary area, such as materials of hard masks or materials of the spacers. Moreover, the distance between the first epitaxial layer to the first gate and the distance between the second epitaxial layer to the second gate can be the same since the distances between the two epitaxial layers and the two gates is determined by the first epitaxial layers formed simultaneously beside the two gates.

Furthermore, the first epitaxial layer has a first profile different from a second profile of the second epitaxial layer. Preferably, the first profile may have a U-shaped cross-sectional profile while the second profile may have a diamond-shaped cross-sectional profile, so that the PMOS transistor constituted by the second epitaxial layer can have good performances as well as the NMOS transistor constituted by the first epitaxial layer.

These and other objectives of the present invention will no doubt become obvious to those of ordinary skill in the art after reading the following detailed description of the preferred embodiment that is illustrated in the various figures and drawings.

DETAILED DESCRIPTION

A gate last for high-k first process is applied in the following embodiment, but it is not limited thereto. The present invention can also apply other semiconductor processes, such as a gate last for high-k last process or a high-k first process etc.

Figure 1:
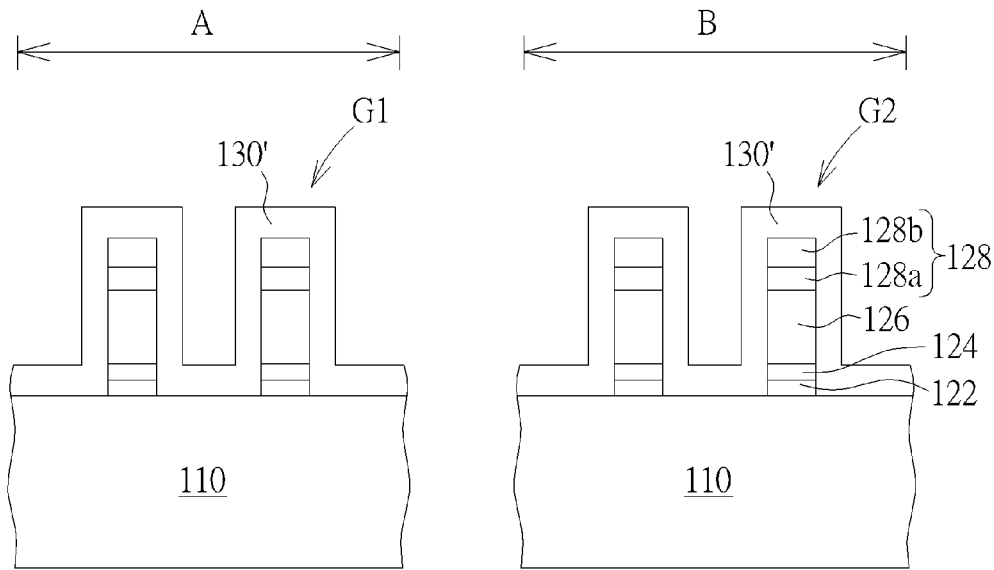
FIGS. 1-7 schematically depict cross-sectional views of an epitaxial process according to an embodiment of the present invention.

FIGS. 1-7 schematically depict cross-sectional views of an epitaxial process according to an embodiment of the present invention. As shown in FIG. 1, a substrate 110 is provided. The substrate 110 has a first area A and a second area B. In this embodiment, the first area A is meant for forming PMOS transistors therein while the second area B is meant for forming NMOS transistors therein, but it is not limited thereto. The first area A and the second area B are used for forming different electrical type transistors. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. An isolation structure (not shown) may be formed in the substrate 110 to electrically isolate each transistor. The isolation structure may be a shallow trench isolation (STI) structure, which may be formed by a shallow trench isolation process, and the forming method is known in the art. For simplifying and clarifying the present invention, the isolation structure is not depicted in these figures.

A buffer layer (not shown), a gate dielectric layer (not shown), a barrier layer (not shown), a sacrificial electrode layer (not shown) and a cap layer (not shown) are sequentially formed from bottom to top and cover the substrate 110. The cap layer (not shown), the sacrificial electrode layer (not shown), the barrier layer (not shown), the gate dielectric layer (not shown) and the buffer layer (not shown) are patterned to form a buffer layer 122, a gate dielectric layer 124, a barrier layer (not shown), a sacrificial electrode layer 126 and a cap layer 128 on the substrate 110. This means that two first gates G1 and two second gates G2 including the buffer layer 122, the gate dielectric layer 124, the barrier layer (not shown), the sacrificial electrode layer 126 and the cap layer 128 are formed. In this embodiment, there are two gates respectively depicted in the first area A and in the second area B for illustrating the present invention clearly. However, the number of gates is not restricted to it, and may vary upon the needs.

The buffer layer 122 may be an oxide layer, which may be formed through a chemical oxide process or a thermal oxide process, but it is not limited thereto. The buffer layer 122 is located between the gate dielectric layer 124 and the substrate 110 to buffer the gate dielectric layer 124 and the substrate 110. Since a gate-last for high-k first process is applied in this embodiment, the gate dielectric layer 124 is a gate dielectric layer having a high dielectric constant, which may be the group selected from hafnium oxide (HfO2), hafnium silicon oxide (HfSiO4), hafnium silicon oxynitride (HfSiON), aluminum oxide (Al2O3), lanthanumoxide (La2O3), tantalum oxide (Ta2O5), yttrium oxide (Y2O3), zirconium oxide (ZrO2), strontium titanate oxide (SrTiO3), zirconium silicon oxide (ZrSiO4), hafnium zirconium oxide (HfZrO4), strontium bismuth tantalite (SrBi2Ta2O9, SBT), lead zirconate titanate (PbZrxTil-x03, PZT) and barium strontium titanate (BaxSrl-xTiO3, BST), but it is not limited thereto. In another embodiment, when a gate-last for high-k last process is applied, the gate dielectric layer 124 will be removed in later processes and then a gate dielectric layer having a high dielectric constant is formed. Therefore, the material of the gate dielectric layer 124 may be just a sacrificial material suitable for being removed in later processes. The barrier layer (not shown) is located on the gate dielectric layer 124 to prevent above disposed metals from diffusing downwards to the gate dielectric layer 124 and from polluting the gate dielectric layer 124. The barrier layer may be a single layer structure or a multilayer structure composed of tantalum nitride (TaN) or titanium nitride (TiN). The sacrificial electrode layer 126 may be made of polysilicon, but it is not limited thereto. The cap layer 128 may be a single layer or a multilayer composed of a nitride layer or an oxide layer used as a patterned hard mask, but it is not limited thereto. In this embodiment, the cap layer 128 is a dual layer composed of a nitride layer 128a and an oxide layer 128b from bottom to top.

Then, a first spacer material 130' is formed to cover the first gates G1, the second gates G2 and the substrate 110. The first spacer material 130' may have a single layer or a multilayer composed of nitride or/and oxide. In this embodiment, the first spacer material 130' is made of nitride.

Figure 2:
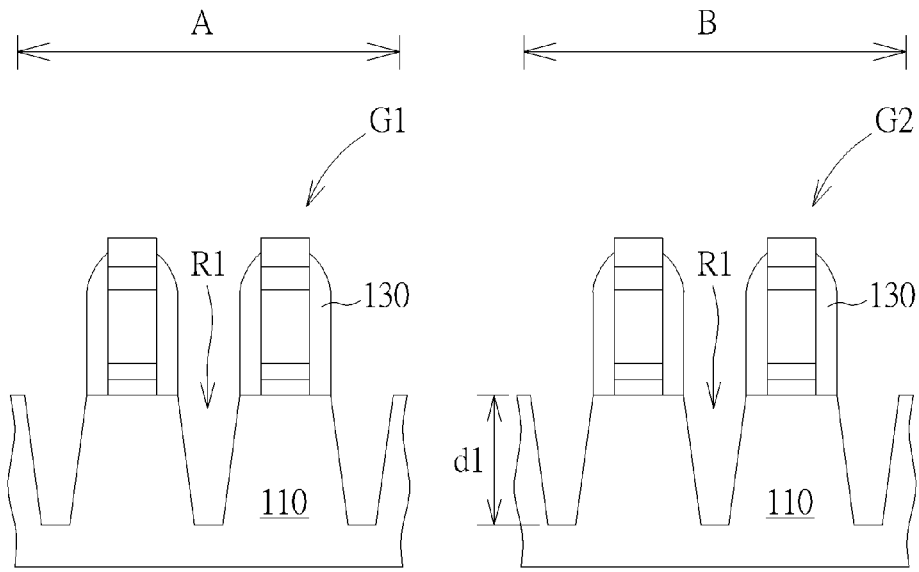

The first spacer material 130' is etched to form first spacers 130 on the substrate 110 beside the first gate G1 and the second gates G2 respectively, as shown in FIG. 2. First recesses R1 may be formed respectively in the substrate 110 beside the first gates G1 and the second gates G2 for later formed epitaxial layers to be formed therein. The first recesses R1 have first profiles. In this embodiment, the first profiles are U-shaped or diamond-shaped cross-sectional profiles, but it is not limited thereto, depending upon the needs. In this embodiment, the first spacer material 130' is etched to form the four first spacers 130 and the first recesses R1 are formed during the same process, thereby reducing processing costs and processing time, but it is not limited thereto. In another embodiment, the first spacer material 130' is etched and the first recesses R1 are formed through different processes. The first spacer material 130' may be etched or the first recesses R1 may be formed by a dry etching process or/and a wet etching process. In one case, the first spacer material 130' may be etched and the first recesses R1 may be formed by performing one dry etching process to form the first spacers 130 and pre-recesses having a predetermined depth d1, and then a wet etching process is performed to form the recesses R1 having a desired profile, but it is not limited thereto.

Figure 3:
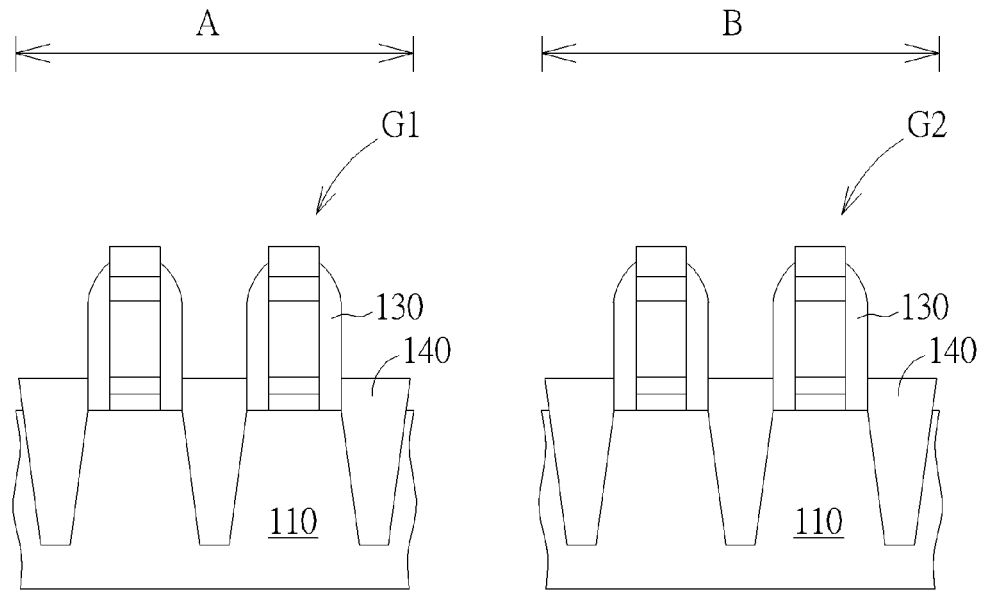

As shown in FIG. 3, first epitaxial layers 140 are formed in the substrate 110 beside the first spacers 130 respectively. In this embodiment, the first epitaxial layers 140 are formed in the first recesses R1 having the first profiles, so the first epitaxial layers 140 have the first profiles as well, but it is not limited thereto. In another embodiment, the first epitaxial layers 140 may be formed right after the first spacers 130 are formed without forming the first recesses R1, wherein the first epitaxial layers 140 may be formed through an implantation process or other processes. In this embodiment, the first epitaxial layers 140 are silicon phosphorous epitaxial layers for forming epitaxial layers of NMOS transistors, but it is not limited thereto. In another embodiment, the first epitaxial layers 140 may be other pentavalent atoms containing epitaxial layers, such as silicon carbon epitaxial layers.

Figure 4:
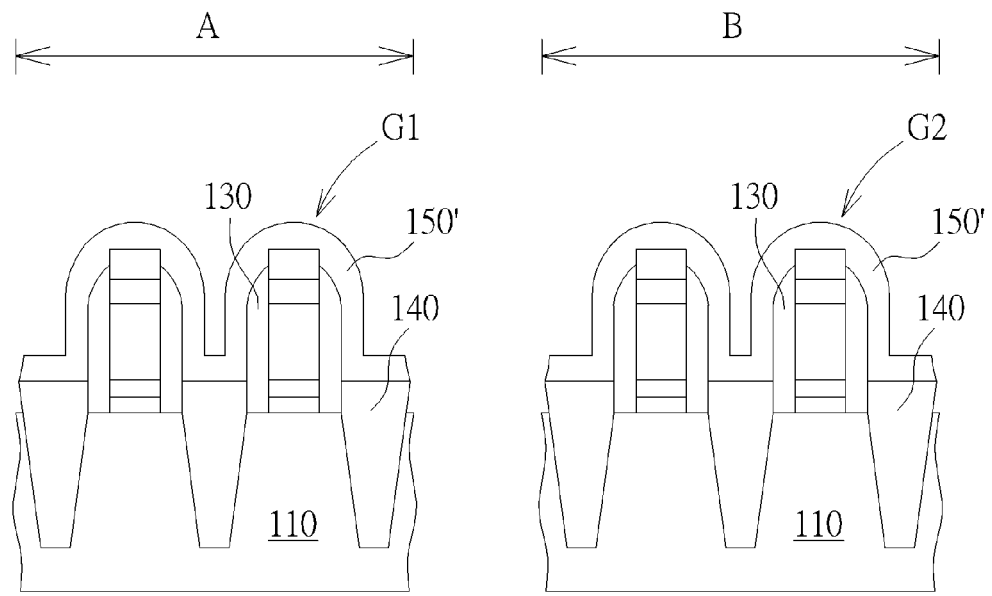

As shown in FIG. 4, a second spacer material 150' is formed to cover the first gates G1, the second gates G2 and the substrate 110. The second spacer material 150' may be a single layer or a multilayer composed of nitride or oxide. In this embodiment, the second spacer material 150' is made of nitride.

Figure 5:
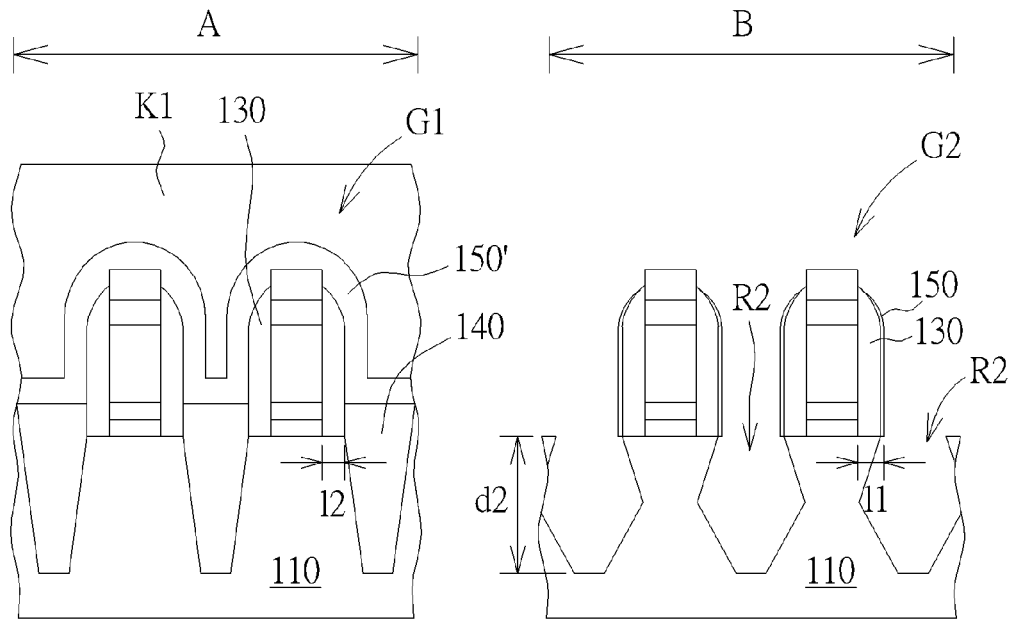

As shown in FIG. 5, the second spacer material 150' covering the second gates G2 is etched to form second spacers 150 on the substrate 110 beside the second gates G2, thereby exposing the first epitaxial layers 140 beside the second spacers 150 while the second spacer material 150' covering the first gates G1 is reserved. More precisely, a photoresist (not shown) may entirely cover the substrate 110, the first gates G1 and the second gates G2, and then the photoresist may be patterned to form a patterned photoresist K1 on the first gates G1 and the substrate 110 beside the first gates G1. Thus, the second spacer material 150' covering the second gates G2 and the substrate 110 beside the second gates G2 are exposed. Then, the exposed second spacer material 150' covering the second gates G2 is etched while reserving the unexposed second spacer material 150' covering the first gates G1, thereby forming the second spacers 150 on the substrate 110 beside the second gates G2.

Then, second recesses R2 in the substrate 110 beside the second gates G2 are formed for later formed epitaxial layers to be formed therein. The second recesses R2 have second profiles different from the first profiles of the first epitaxial layers 140. In this embodiment, the second profile is a diamond-shaped cross-sectional profile while the first profile of the first epitaxial layer 140 is a U-shaped cross-sectional profile. In this embodiment, the second recesses R2 are formed by removing the first epitaxial layers 140 to expose the first recesses R1 of FIG. 2 and further enlarging or shaping the first recesses R1 into the second recesses R2, but it is not limited thereto. In another embodiment, the first profile of the first epitaxial layer 140 is a diamond-shaped cross-sectional profile while the second profile of the second recess R2 is a diamond-shaped cross-sectional profile as well.

In this embodiment, the second spacer material 150' is etched and the second recesses R2 are formed during the same process, thereby reducing processing costs and the processing time, but it is not limited thereto. In another embodiment, the second spacer material 150' is etched and the second recesses R2 are formed by different processes. The second spacer material 150' may be etched or the second recesses R2 may be formed through a dry etching process or/and a wet etching process.

The first spacers 130 and the second spacers 150 may comprise different materials so as to etch the second spacer material 150' without affecting the first spacers 130, such as damaging the first spacers 130 while etching or leaving residues on the first spacers 130. Preferably, the first spacers 130 and the second spacers 150 include materials having etching selectivity. Still preferably, the second spacers 150 have an etching rate higher than the first spacers 130, so that the second spacers 150 can be formed without etching the first spacers 130 substantially. For example, the first spacers 130 and the second spacers 150 may all be nitride spacers but with different etching rates. Preferably the etching rate of the second spacers 150 is higher than the etching rate of the first spacers 130. In one case, the second spacers 150 have a thickness substantially equal to zero, so that the distance l1 between later formed epitaxial layers in the substrate 110 beside the second gates G2 and the second gates G2 can be the same as the distance l2 between the first epitaxial layers 140 and the first gates G1. In another case, the distance l1 between later formed epitaxial layers in the substrate 110 beside the second gates G2 and the second gates G2 can be shorter than the distance l2 between the first epitaxial layers 140 and the first gates G1 by further etching the substrate 110 so that the second recesses R2 can have a distance to the second gates G1 shorter than the distance of the first recesses R2 to the first gates G2.

Figure 6:
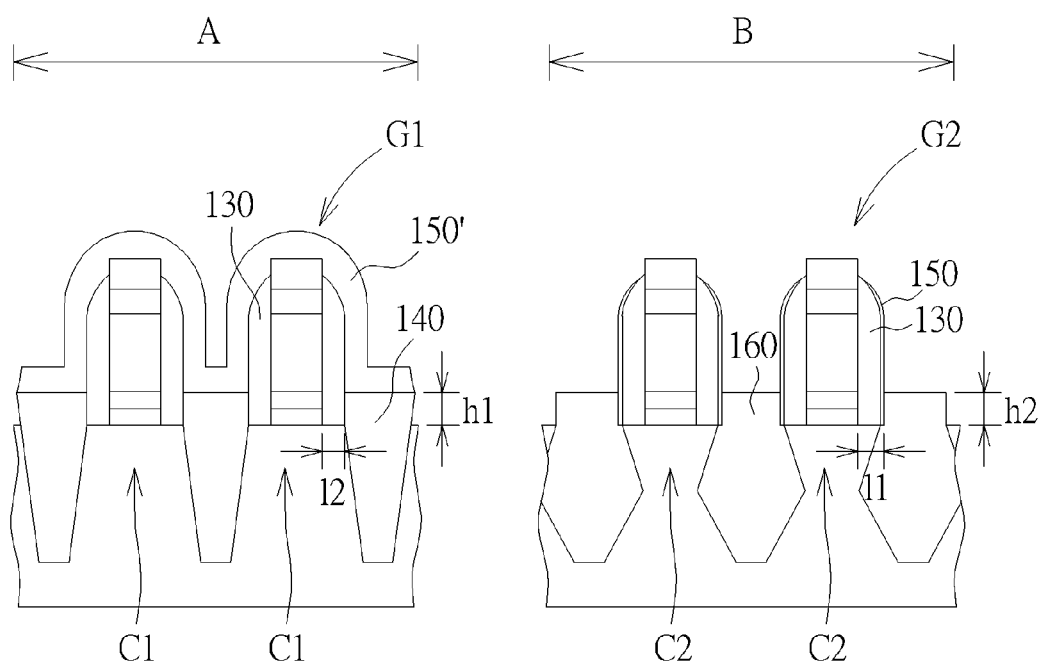
Figure 7:
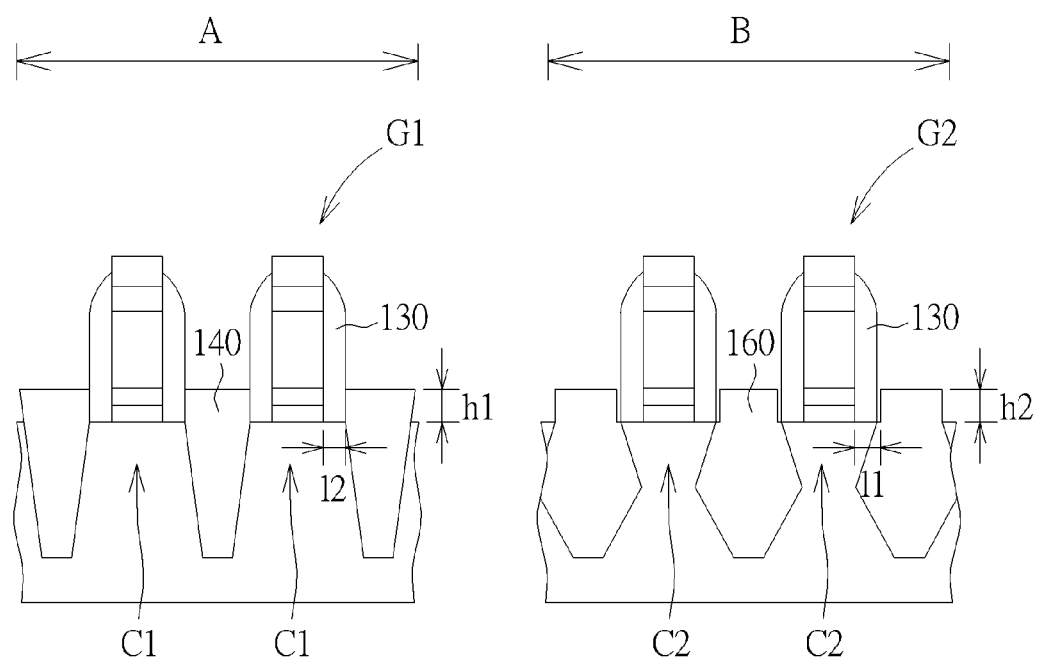

Thereafter, the patterned photoresist K1 is removed as shown in FIG. 6. Then, the second epitaxial layers 160 are formed in the second recesses R2. Then, the second spacer material 150' and the second spacers 150 may be removed, as shown in FIG. 7. Thus, the distance l1 between the epitaxial layers 160 in the substrate 110 beside the second gates G2 and the second gates G2 can be larger than the distance l2 between the first epitaxial layers 140 and the first gates G1 by forming the second spacers 150. The second epitaxial layers 160 may be silicon germanium epitaxial layers to serve as epitaxial layers for PMOS transistors, but it is not limited thereto. In another embodiment, the second epitaxial layers 160 may be other trivalent atoms containing epitaxial layers. In some cases, the heights h1 of the first epitaxial layers 140 may be different from the heights h2 of the second epitaxial layers 160.

It is emphasized that, since the first epitaxial layers 140 beside the first gates G1 and the second gates G2 are formed simultaneously, and then the first epitaxial layers 140 beside the second gates G2 are replaced by the second epitaxial layers 160, the first epitaxial layers 140 and the second epitaxial layers 160 (used for different electrical types of transistors) can be formed by performing a photolithography process only once (thereby merely using one patterned photoresist K1). Therefore the boundary problems observed in the prior art caused by performing photolithography processes twice, such as the boundary areas of the first area A and the second area B being uncovered or overlapped by two photoresists resulting in leaving boundary residues of spacer materials or leading to over-etching, can be avoided.

Due to the second recesses R2 having the second profiles, the second epitaxial layers 160 formed therein can also have the second profiles. Thanks to the second profile having a diamond-shaped cross-sectional profile, the stress induced in gate channels C2 can be strengthened. Since the stress in gate channels C2 of formed PMOS transistors is harder to be induced than that in gate channels C1 of formed NMOS transistors, it is preferably strengthened by enlarging the first recesses R1 into second recesses R2 or by changing the first profiles of the first recesses R1 into second profiles of the second recesses R2. Therefore, the second epitaxial layers 160 formed after the first epitaxial layers 140 are preferably used for forming PMOS transistor while the first epitaxial layers 140 are used for forming NMOS transistors. However, the present invention is not restricted thereto, the first epitaxial layers 140 may be used for forming PMOS transistors and the second epitaxial layers may be used for forming NMOS transistors, depending upon the needs.

Furthermore, the first epitaxial layers 140 are removed and the second recesses R2 are formed during the same process; in other words, single etching process may be performed to remove the first epitaxial layers 140 and further etch the substrate 110 so as to form the second recesses R2, which may be larger than the first recesses R1 or have different profiles from the first recesses R1, for reducing the processing costs and the processing time, but it is not limited thereto. In another embodiment, the first epitaxial layers 140 are removed and the second recesses R2 are further formed by different processes. When the first epitaxial layers 140 are removed, the diamond-shaped cross-sectional profiles of the first epitaxial layers 140 would be moved close to the center points. In this embodiment, the first epitaxial layers 140 having the first profiles in the substrate 110 beside the second spacers 150 are replaced by the second epitaxial layers 160 having the second profiles different from the first profiles through the steps depicted in FIGS. 4-6. However, the steps of FIGS. 4-6 can be replaced by other processing steps. For example, the second recesses R2 may not be formed and the first epitaxial layers 140 are directly implanted to form the second epitaxial layers 160. Moreover, the first epitaxial layers 140 may include bottom buffer layers, and the bottom buffer layers of the first epitaxial layers 140 may remain while the first epitaxial layers 140 are replaced by the second epitaxial layers 160, so that the remaining bottom buffer layers can serve as bottom buffer layers and barrier layers of the second epitaxial layers 160. Besides, the first epitaxial layers 140 and the second epitaxial layers 160 may include multi-layer structures, such as a buffer layer, a bulk layer and a cap layer from bottom to top or from external to inner, and the doping distribution, such as the phosphorous doping distribution of the first epitaxial layers 140 and the germanium doping distribution of the second epitaxial layers 160 may be gradually increasing from bottom to top or from the outer side to the inner side, but it is not limited thereto.

To summarize, the present invention provides an epitaxial process that forms first spacers beside first gates and second gates simultaneously, then forms first epitaxial layers beside the first spacers simultaneously and then replaces the first epitaxial layers beside the second gates by second epitaxial layers. Thus, the first epitaxial layers suited for forming NMOS transistors and the second epitaxial layers suited for forming PMOS transistors can be formed. Only one lithography process is performed in the present invention, so the boundary area overlapped or uncovered by two photoresists while performing lithography processes twice of the prior art for forming different epitaxial layers can be avoided, thereby avoiding over-etching or leaving residues of materials such as materials of hard masks (spacer materials) in the boundary area.

Moreover, the distance between the first epitaxial layers to the first gates and the distance between the second epitaxial layers to the second gates can be the same due to the distance between the two kinds of epitaxial layers and the two gates being determined when the first epitaxial layers are formed simultaneously beside the two gates.

Furthermore, the first epitaxial layers have first profiles different from second profiles of the second epitaxial layers. Preferably, the first profiles may be U-shaped cross-sectional profiles while the second profiles may be diamond-shaped cross-sectional profiles, so that the PMOS transistors constituted by the second epitaxial layers can have good performances as well as the NMOS transistors constituted by the first epitaxial layers. In one case, the first epitaxial layers beside the second gates can be replaced by the second epitaxial layers though forming the second recesses in the substrate beside the second gates for forming the second epitaxial layers therein such as removing the first epitaxial layers to expose first recesses for forming the first epitaxial layers therein and further shaping the first recesses into the second recesses.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An epitaxial process, comprising:
   forming a first gate and a second gate on a substrate;
   forming two first spacers on the substrate beside the first gate and the second gate respectively;
     forming two first epitaxial layers having first profiles in the substrate beside the two first spacers respectively;
     forming a second spacer material covering the first gate and the second gate;
   etching the second spacer material covering the second gate to form a second spacer on the substrate beside the second gate and expose the first epitaxial layer beside the second spacer while reserving the second spacer material covering the first gate; and
   replacing the exposed first epitaxial layer in the substrate beside the second spacer by a second epitaxial layer having a second profile different from the first profile, wherein the first epitaxial layers comprise bottom buffer layers, and the bottom buffer layer of the exposed first epitaxial layer remains while the exposed first epitaxial layer is replaced by the second epitaxial layer to serve as a bottom buffer layer of the second epitaxial layer.

2. The epitaxial process according to claim 1, wherein the step of forming the two first spacers comprises:
   forming a first spacer material covering the first gate and the second gate; and
   etching the first spacer material to form the two first spacers on the substrate beside the first gate and the second gate respectively.

3. The epitaxial process according to claim 1, wherein the heights of the first epitaxial layers are different from the height of the second epitaxial layer.

4. The epitaxial process according to claim 1, wherein the first epitaxial layers comprise silicon phosphorous epitaxial layers.

5. The epitaxial process according to claim 1, wherein the second epitaxial layer comprises a silicon germanium epitaxial layer.

6. The epitaxial process according to claim 1, further comprising:
   forming two first recesses having the first profiles in the substrate beside the first gate and the second gate respectively for the two first epitaxial layers to be formed therein after the two first spacers are formed.

7. The epitaxial process according to claim 1, wherein the first spacers and the second spacer comprise materials having etching selectivity.

8. The epitaxial process according to claim 1, wherein the second spacer has an etching rate higher than that of the first spacers.

9. The epitaxial process according to claim 1, wherein the first spacers and the second spacer comprise nitride spacers with different etching rates.

10. The epitaxial process according to claim 1, wherein the first spacers and the second spacer have different materials.

11. The epitaxial process according to claim 1, wherein the step of forming the second spacer comprises:
    forming a patterned photoresist on the first gate and the substrate beside the first gate;
    etching the exposed second spacer material covering the second gate while reserving the unexposed second spacer material covering the first gate to form the second spacer; and
    removing the patterned photoresist.

12. The epitaxial process according to claim 1, further comprising:
    forming a second recess having the second profile in the substrate beside the second gate for the second epitaxial layer to be formed therein after the second spacer is formed.

13. The epitaxial process according to claim 12, wherein the step of replacing the exposed first epitaxial layer in the substrate beside the second spacer by the second epitaxial layer comprises:
    removing the exposed first epitaxial layer and forming the second recess in the substrate beside the second spacer; and
    forming the second epitaxial layer in the second recess.

14. The epitaxial process according to claim 13, wherein the first epitaxial layer is removed and the second recess is formed during the same process.

15. The epitaxial process according to claim 13, wherein the steps of forming the second spacer and removing the first epitaxial layer are performed during the same process.

16. The epitaxial process according to claim 1, wherein the first profile has a U-shaped cross-sectional profile while the second profile has a diamond-shaped cross-sectional profile.

17. The epitaxial process according to claim 1, wherein the distance between the first epitaxial layer and the first gate is shorter than the distance between the second epitaxial layer and the second gate.

18. An epitaxial process, comprising:
    forming a first gate and a second gate on a substrate;
    forming two first spacers on the substrate beside the first gate and the second gate respectively;
      forming two first epitaxial layers having first profiles in the substrate beside the two first spacers respectively;
      forming a second spacer material covering the first gate and the second gate;
    etching the second spacer material covering the second gate to form a second spacer on the substrate beside the second gate and expose the first epitaxial layer beside the second spacer while reserving the second spacer material covering the first gate; and
    replacing the exposed first epitaxial layer in the substrate beside the second spacer by a second epitaxial layer having a second profile different from the first profile, wherein the minimum distance between the second epitaxial layers beside the second gate is shorter than the minimum distance between the first epitaxial layers beside the first gate.

* * * * *